(12) United States Patent
Ulavi et al.

(10) Patent No.: US 11,049,699 B2
(45) Date of Patent: Jun. 29, 2021

(54) GAS BOX FOR CVD CHAMBER

(71) Applicant: Applied Materials, Inc., Santa Clara, CA (US)

(72) Inventors: Tejas Ulavi, San Jose, CA (US); Amit Kumar Bansal, Milpitas, CA (US); Nitin Pathak, Mumbai (IN); Ajit Balakrishna, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 116 days.

(21) Appl. No.: 16/516,419

(22) Filed: Jul. 19, 2019

(65) Prior Publication Data

US 2020/0043704 A1 Feb. 6, 2020

Related U.S. Application Data

(60) Provisional application No. 62/712,852, filed on Jul. 31, 2018.

(51) Int. Cl.
*H01J 37/32* (2006.01)
*C23C 16/455* (2006.01)
*H01L 21/02* (2006.01)

(52) U.S. Cl.
CPC .. *H01J 37/32449* (2013.01); *C23C 16/45565* (2013.01); *H01J 37/32357* (2013.01); *H01L 21/02274* (2013.01); *H01J 2237/3321* (2013.01)

(58) Field of Classification Search
CPC .......... H01J 37/32449; H01J 37/32357; H01J 2237/3321; C23C 16/45565; C23C 16/4558; H01L 21/02274

USPC .............. 118/715, 723 ME, 723 ER, 723 IR; 156/345.1, 345.35
See application file for complete search history.

(56) References Cited

U.S. PATENT DOCUMENTS

| | | | |
|---|---|---|---|
| 7,252,716 B2 | 8/2007 | Kim et al. | |
| 8,512,509 B2 | 8/2013 | Bera et al. | |
| 2005/0178748 A1 | 8/2005 | Buchberger et al. | |
| 2006/0090700 A1 | 5/2006 | Satoh et al. | |

(Continued)

FOREIGN PATENT DOCUMENTS

WO 2005/119733 A1 12/2005

OTHER PUBLICATIONS

International Search Report and Written Opinion dated Oct. 17, 2019 for Application No. PCT/US2019/040607.

*Primary Examiner* — Rudy Zervigon
(74) *Attorney, Agent, or Firm* — Patterson + Sheridan, LLP

(57) ABSTRACT

Embodiments of the present disclosure relate to apparatus for improving quality of films deposited on a substrate by a CVD process. More specifically, a branched gas feed assembly uniformly distributes a process gas entering an annular plenum. Each conduit of a first plurality of conduits having substantially equal flow conductance is in fluid communication with one or more conduits of a second plurality of conduits having substantially equal flow conductance. Each conduit of the second plurality of conduits terminates at one of a plurality of outlets. Each outlet of the plurality of outlets is in fluid communication with one or more inlet ports of a plurality of inlet ports formed in the annular plenum. Each inlet port of the plurality of inlet ports is spaced equidistant about a central axis of the annular plenum.

16 Claims, 5 Drawing Sheets

(56) References Cited

U.S. PATENT DOCUMENTS

2006/0112876 A1* 6/2006 Choi ................... C23C 16/4558
                                                      118/715
2011/0162800 A1   7/2011 Noorbakhsh et al.
2011/0256645 A1  10/2011 Tam et al.
2017/0092511 A1*  3/2017 Basu ................. H01J 37/32633

* cited by examiner

GAS BOX FOR CVD CHAMBER

CROSS-REFERENCE TO RELATED APPLICATIONS

This application claims benefit of U.S. Provisional Patent Application No. 62/712,852, filed Jul. 31, 2018, the entirety of which is herein incorporated by reference.

BACKGROUND

Field

Embodiments of the present disclosure relate to a processing apparatus for fabricating substrates. More specifically, the present disclosure relates to a gas flow apparatus.

Description of the Related Art

Semiconductor substrates are commonly fabricated by a series of process operations in which layers are deposited on a substrate and the deposited material is etched into desired patterns. The process operations commonly include physical vapor deposition (PVD), chemical vapor deposition (CVD), plasma enhanced CVD (PECVD), and other plasma processing. Process operations may involve delivering a process gas to a process chamber and utilize a powered showerhead to generate a plasma in a process chamber.

One problem encountered with processing of substrates is the difficulty associated with establishing uniform gas flow into the process chamber. Non-uniform gas flow leads to insufficient mixing of the process gas resulting in non-uniform processing of the substrate. The non-uniform gas flow and mixing results in non-uniform layers being deposited on the substrate.

Thus, what is needed in the art are apparatus to improve gas flow symmetry and plasma distribution in the process chamber.

SUMMARY

In one embodiment, an apparatus is provided which includes a lid and a chamber body defining a process volume therein. The lid has a port formed therethrough. The apparatus includes a gas feed tube which includes a first end and a second end. An opening at the first end of the gas feed tube is in fluid communication with the port. Each conduit of a first plurality of conduits has substantially equal flow conductance and is in fluid communication with the gas feed tube. Each conduit of the first plurality of conduits terminates at one of a first plurality of outlets. Each conduit of a second plurality of conduits has substantially equal flow conductance and is in fluid communication with one of the first plurality of outlets. Each conduit of the second plurality of conduits terminates at one of a second plurality of outlets. A plenum body defining an annular plenum therein has a plurality of inlet ports formed therein. Each outlet of the second plurality of outlets is in fluid communication with at least one of the plurality of inlet ports. The plurality of inlet ports are spaced equidistant about a central axis of the plenum body and the gas feed tube has at least one aperture in fluid communication with the annular plenum.

In another embodiment, an apparatus is provided which includes a lid with a port formed therethrough. The apparatus includes a gas feed tube which includes a first end and a second end. An opening at the first end of the gas feed tube is in fluid communication with the port. A first plenum body defines a first plenum therein which has a first inlet in fluid communication with the gas feed tube. The first plenum body has at least a first outlet and a second outlet. The at least the first outlet and the second outlet each have substantially equal flow conductance. A second plenum body defines a second plenum therein. The second plenum body has at least a second inlet and a third inlet. The second inlet and the third inlet are in fluid communication with the first outlet and the second outlet. The second plenum body has a third outlet, a fourth outlet, a fifth outlet, and a sixth outlet formed therethrough. The third outlet, the fourth outlet, the fifth outlet, and the sixth outlet each has substantially equal flow conductance. A third plenum body defines an annular plenum therein. The third plenum body has a plurality of inlet ports formed therein. Each port of the plurality of inlet ports is spaced equidistant about a central axis of the third plenum body and is in fluid communication with at least one of the third outlet, the fourth outlet, the fifth outlet, and the sixth outlet. The gas feed tube has at least one aperture in fluid communication with the annular plenum.

In another embodiment, an apparatus is provided which includes a gas feed tube has a first end and a second end opposite the first end. The gas feed tube includes a plurality of inlet ports formed therethrough. A first plenum body defines a first plenum therein. The first plenum body includes a first plurality of outlets formed therein. The first plenum is in fluid communication with the gas feed tube. A second plenum body defines a second plenum therein. The second plenum body includes a first plurality of inlets and a second plurality of outlets. A third plenum body defines a third plenum therein and includes a second plurality of inlets and a third plurality of outlets. A fourth plenum body defines an annular plenum therein. The fourth plenum body includes a third plurality of inlets and a fourth plurality of outlets formed therein. Each conduit of a first plurality of conduits is disposed between one of the first plurality of outlets and one of the first plurality of inlets or between one of the first plurality of outlets and one of the second plurality of inlets. Each conduit of a second plurality of conduits is disposed between one of the second plurality of outlets and one of the third plurality of inlets. Each conduit of a third plurality of conduits is disposed between one of the third plurality of outlets and one of the third plurality of inlets. One or more passages are disposed between the fourth plurality of outlets and the plurality of inlet ports.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to apparatus for improving quality of films deposited on a substrate by a CVD process. More specifically, a branched gas feed assembly uniformly distributes a process gas entering an annular plenum. Each conduit of a first plurality of conduits having substantially equal flow conductance is in fluid communication with one or more conduits of a second plurality of conduits having substantially equal flow conductance. Each conduit of the second plurality of conduits terminates at one of a plurality of outlets. Each outlet of the plurality of outlets is in fluid communication with one or more inlet ports of a plurality of inlet ports formed in the annular plenum. Each inlet port of the plurality of inlet ports is spaced equidistant about a central axis of the annular plenum.

Figure 1:
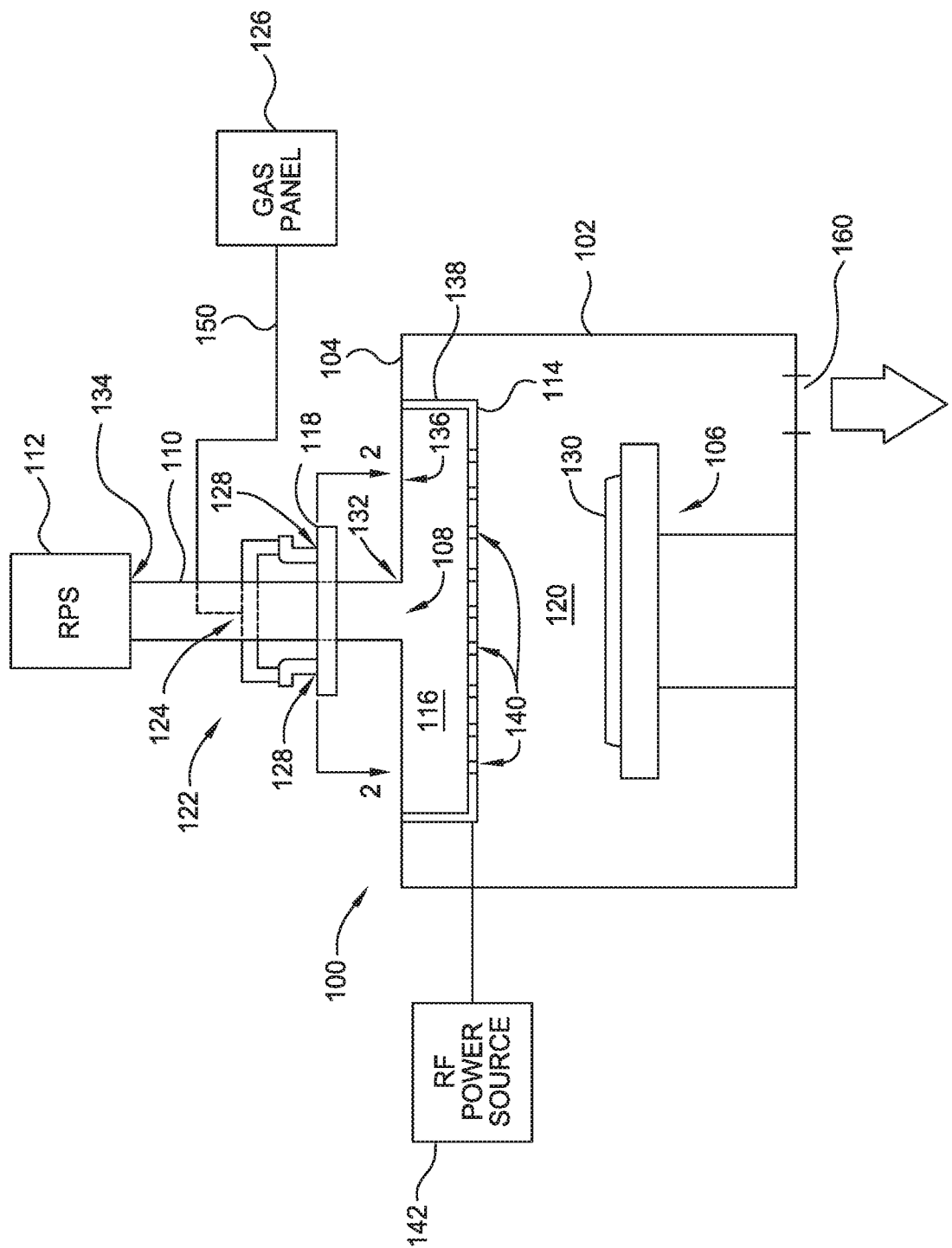
FIG. 1 illustrates a schematic view of a process chamber according to an embodiment of the disclosure.

FIG. 1 illustrates a schematic, cross-sectional view of a process chamber 100 according to one embodiment. The process chamber 100 includes a lid 104 and sidewalls 102 defining a process volume 120 therein. The process chamber 100 is fabricated from a process resistant material, such as aluminum or stainless steel. A substrate support 106 is disposed in the process volume 120. The substrate support 106 supports a substrate 130 during processing. In one embodiment, the substrate support 106 is fabricated from a ceramic material. In another embodiment, the substrate support 106 is fabricated from a graphite material coated with a silicon containing material, such as a silicon carbide material.

The lid 104 has a port 108 formed therethrough. The port 108 is coupled to an opening at a first end 132 of a gas feed tube 110. A second end 134 of the gas feed tube 110 is connected to a remote plasma source 112. A showerhead 114 is coupled to a surface 136 of the lid 104 facing the substrate support 106 via one or more standoffs 138. A plurality of passages 140 are formed through the showerhead 114. The lid 104 and showerhead 114 define a plenum 116 therebetween which enables gas exiting the port 108 to enter into the plenum 116. Gas travels from the plenum 116 through the passages 140 in the showerhead 114 and enters into the process volume 120. A radio frequency (RF) power source 142 is coupled to the showerhead 114.

One or more process gases are fed into the gas feed tube 110 from a plenum body 118 surrounding the gas feed tube 110. In one embodiment, which can be combined with one or more embodiments discussed above, a purge gas enters the gas feed tube 110 from the remote plasma source 112. In one embodiment, which can be combined with one or more embodiments discussed above, the plenum body 118 is annular. A branch gas feed assembly 122 is coupled to the plenum body 118. The branch gas feed assembly 122 has an inlet 124 coupled to a conduit 150 which extends between the inlet 124 and a gas panel 126. A plurality of outlets 128 of the branch gas feed assembly 122 is coupled to the plenum body 118. In one embodiment, which can be combined with one or more embodiments discussed above, the plenum body 118 is fabricated from a process resistant material, such as aluminum or stainless steel.

An exhaust port 160 is formed through the process chamber 100 opposite the lid 104. In one embodiment, which can be combined with one or more embodiments discussed above, the exhaust port 160 is formed through the sidewall 102 adjacent to the lid 104. The exhaust port 160 may be coupled to a vacuum pump (not shown) to evacuate gases from the process volume 120.

In operation, a substrate 130 is positioned in the process chamber 100 on the substrate support 106. A purge gas flows from the remote plasma source 112 into the gas feed tube 110. A process gas is delivered to the process volume 120 through the branch gas feed assembly 122. The process gas flows through the conduit 150 and the branch gas feed assembly 122 to the plenum body 118. Upon entering the plenum body 118, the process gas is symmetrically distributed therein. Process gas is delivered from the plenum body 118 radially inward to the gas feed tube 110 in a radially symmetric distribution. The radially symmetric distribution of the process gas enables mixing of the process gas and purge gas in the gas feed tube 110.

As the gases (including the purge gas) flow in the gas feed tube 110 toward the process volume 120, the gases continually mix in the gas feed tube 110 until the gases exit the port 108 and flow into the plenum 116. Further mixing of the gases occurs in the plenum 116. The gases travel through the passages 140 in the showerhead 114 and into the process volume 120. The gases in the process volume 120 can be utilized to etch or deposit material on the substrate 130. The RF power source 142 supplies RF energy to the showerhead 114 to generate and/or maintain a plasma in the process volume 120. In one embodiment, which can be combined with one or more embodiments discussed above, the substrate support 106 is heated and a deposition process is performed to deposit material on the substrate 130. After the substrate 130 is processed, the flow of process gases is terminated at the gas panel 126.

After the substrate 130 is removed from the process chamber 100, a cleaning agent is delivered from the remote plasma source 112 through the gas feed tube 110 and into the process chamber 100 to clean the process chamber 100 and the showerhead 114. In one embodiment, which can be combined with one or more embodiments discussed above, the cleaning agent is a plasma formed in the remote plasma source 112 which delivers Fluorine radicals to the process volume 120 to clean an interior of the process chamber 100. In this embodiment, a purge gas is flowed from the gas panel 126 through the branch gas feed assembly 122 and into the process volume 120.

Figure 2:
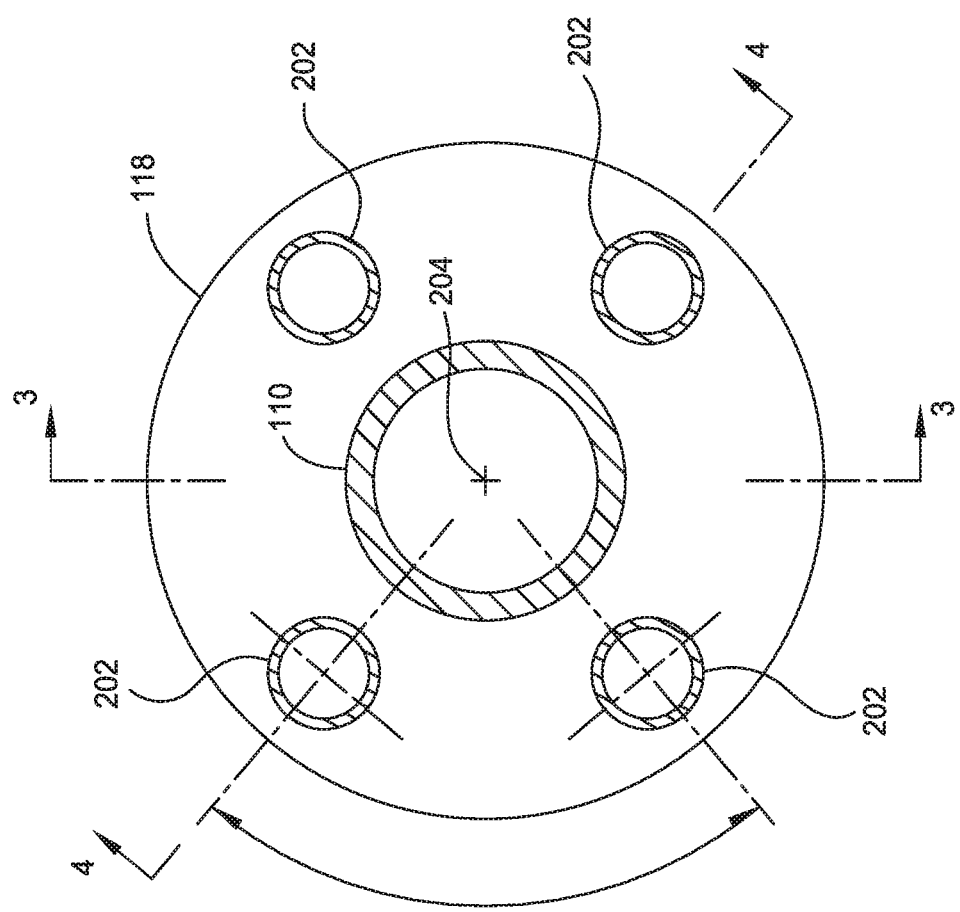
FIG. 2 illustrates a sectional plan view of a plenum body according to an embodiment of the disclosure.

FIG. 2 illustrates a sectional plan view of the plenum body 118 according to one embodiment. The plenum body 118 has one or more inlet ports 202 formed therein. The inlet ports 202 are spaced equidistant about a central axis 204 of the plenum body 118. The gas feed tube 110 passes through the plenum body 118 and is disposed concentrically about the central axis 204. Thus, the central axis 204 of the plenum body 118 is coaxial with the central axis of the gas feed tube 110 (i.e., the central axis 204 of the plenum body 118 is the central axis of the gas feed tube 110).

Each of the inlet ports 202 align with and are coupled to an outlet of the branch gas feed assembly 122, such as the outlets 128 described with respect to FIG. 1. The inlet ports 202 each have a substantially equal flow conductance. Thus, a flow rate of gas flowing through each of the inlet ports 202 is substantially equal. In one embodiment, which can be combined with one or more embodiments discussed above, the shape and dimensions of the inlet ports 202 are substantially equal to enable substantially equal flow conductance amongst each of the inlet ports 202. In one example, substantially equal flow is a volumetric flow rate within +/−10%, such as +/−8%, such as +/−5%, such as +/−3%, such as +/−1%, such as +/−0.5%.

Figure 3:
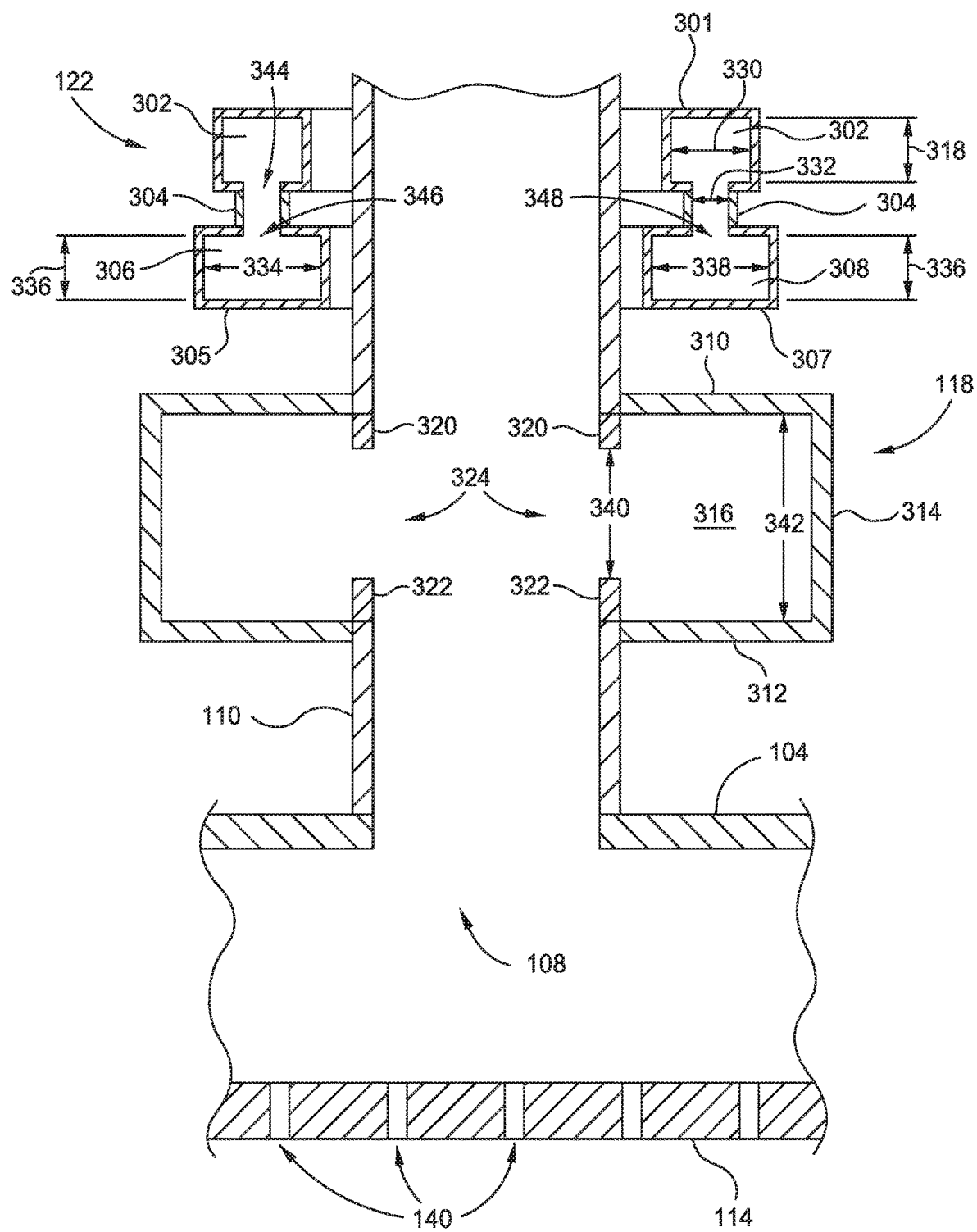
FIG. 3 illustrates a schematic, cross-sectional view of a branch gas feed assembly according to an embodiment of the disclosure.

FIG. 3 illustrates a schematic, cross-sectional view of the branch gas feed assembly 122 according to one embodiment. The branch gas feed assembly 122 includes a first plenum body 301 defining a first plenum 302, a second plenum body 305 defining a second plenum 306, a third plenum body 307 defining a third plenum 308, and the plenum body 118. In one embodiment, which can be combined with one or more embodiments discussed above, the first plenum 302 is a continuous semiannular plenum that surrounds the gas feed tube 110. In another embodiment, the first plenum 302 is a continuous annular plenum (not shown) surrounding the gas feed tube 110. In one embodiment, which can be combined with one or more embodiments discussed above, the second plenum 306 and the third plenum 308 are opposing semiannular plenums that each surround a portion of the gas feed tube 110. In this embodiment, the second plenum body 305 and the third plenum body 307 are discontinuous such that the second plenum 306 and the third plenum 308 are not in fluid communication with one another. In another embodiment, which can be combined with one or more embodiments discussed above, the second plenum 306 is in fluid communication with the third plenum 308 to form a continuous annular plenum (not shown) surrounding the gas feed tube 110.

In one embodiment, which can be combined with one or more embodiments discussed above, the first plenum body 301, the second plenum body 305, and the third plenum body 307 are fabricated from the same material. For example, the first plenum body 301, the second plenum body 305, and the third plenum body 307 may be fabricated from a process resistant material, such as aluminum, or alloys thereof. In one embodiment, which can be combined with one or more embodiments discussed above, the first plenum body 301, the second plenum body 305, and the third plenum body 307 are fabricated from a metallic material coated with Aluminum Oxide ($Al_2O_3$).

The second plenum 306 and the third plenum 308 are disposed in substantially the same horizontal plane with one another. The second plenum body 305 and the third plenum body 307 are disposed between the first plenum body 301 and the lid 104. The first plenum 302 is coupled to the second plenum 306 and the third plenum 308 via one or more conduits 304 extending between one or more outlets 344 formed through the first plenum body 301 and one or more inlets 346 formed through the second plenum body 305 and one or more inlets 348 formed through the third plenum body 307. As such, the one or more conduits 304 extend between the first plenum body 301 and each of the second plenum body 305 and the third plenum body 307 to enable the first plenum 302 to be in fluid communication with both of the second plenum 306 and the third plenum 308. Thus, the one or more outlets 344 are in fluid communication with the one or more inlets 346 formed through the second plenum body 305 and one or more inlets 348 formed through the third plenum body 307.

In one embodiment, which can be combined with one or more embodiments discussed above, an interior diameter 330 of the first plenum 302 is smaller than an interior diameter 334 of the second plenum 306 and an interior diameter 338 of the third plenum 308. In another embodiment, which can be combined with one or more embodiments discussed above, the interior diameter 330 of the first plenum 302 is substantially equal to the interior diameter 334 of the second plenum 306 and the interior diameter 338 of the third plenum 308. Similarly, in one embodiment, which can be combined with one or more embodiments discussed above, a height 318 of the first plenum 302 is less than a height 336 of the second plenum 306 and the third plenum 308. In another embodiment, which can be combined with one or more embodiments discussed above, the height 318 of the first plenum 302 is substantially equal to the height 336 of the second plenum 306 and the third plenum 308.

In one example, the interior diameter 334 of the second plenum 306 and the interior diameter 338 of the third plenum 308 are substantially equal. Similarly, a volume of the second plenum 306 and a volume of the third plenum 308 may be substantially equal. An interior diameter 332 of the one or more conduits 304 is less than the interior diameter 330 of the first plenum 302. The interior diameter 332 of the one or more conduits 304 is also less than the interior diameter 334, 338 of the second plenum 306 and the third plenum 308, respectively.

The plenum body 118 is disposed on and coupled to the gas feed tube 110 between the lid 104 and each of the second plenum 306 and the third plenum 308. The plenum body 118 includes a first body member 310, a second body member 312, and a third body member 314. The first body member 310 extends laterally from and radially outward of the gas feed tube 110. The second body member 312 extends laterally from and radially outward of the gas feed tube 110 opposite and parallel to the first body member 310. The third body member 314 extends between and is oriented normal to the first body member 310 and the second body member 312. The first body member 310, the second body member 312, and the third body member 314 define an annular plenum 316 therein. In one embodiment, which can be combined with one or more embodiments discussed above, a height 342 of the annular plenum 316 is larger than the height 318 of the first plenum 302 and the height 336 of the second plenum 306 and the third plenum 308. In another embodiment, the height 342 of the annular plenum 316 is smaller than the height 318 of the first plenum 302 and the height 336 of the second plenum 306 and the third plenum 308.

The annular plenum 316 is in fluid communication with the gas feed tube 110 via one or more apertures 324 formed in the gas feed tube 110. Each of the one or more apertures 324 has substantially equal flow conductance. In one embodiment, which can be combined with one or more embodiments discussed above, the one or more apertures 324 is a single continuous annular opening about the central axis 204 of the gas feed tube 110. In another embodiment, which can be combined with one or more embodiments discussed above, the one or more apertures 324 are a plurality of discontinuous apertures disposed about a circumference of the gas feed tube 110. In this embodiment, each of the one or more apertures 324 have a substantially similar shape and dimensions to enable substantially equal flow conductance of gas through the one or more apertures 324 from the annular plenum 316 to the gas feed tube 110.

One or more constricting members 320, 322 are disposed in the one or more apertures 324. The constricting members 320, 322 are coupled to the gas feed tube 110 where the first body member 310 and the second body member 312 are coupled to the gas feed tube 110, respectively. The constricting members 320, 322 are disposed parallel to the gas feed tube 110 and normal to the first body member 310 and the second body member 312. A height 340 of the one or more apertures 324 is smaller than the height 342 of the annular plenum 316 due to the constricting members 320, 322. The smaller diameter of the one or more apertures 324 creates a jetted flow of gas from the annular plenum 316 into the gas feed tube 110.

In operation, one or more process gases flow into the first plenum 302 via one or more inlets (not shown). The process gas fills the first plenum 302 and propagates through the one or more conduits 304 into the second plenum 306 and the third plenum 308. The process gas fills the second plenum 306 and the third plenum 308 and travels through one or more conduits (shown in FIG. 4) to the annular plenum 316.

Figure 4:
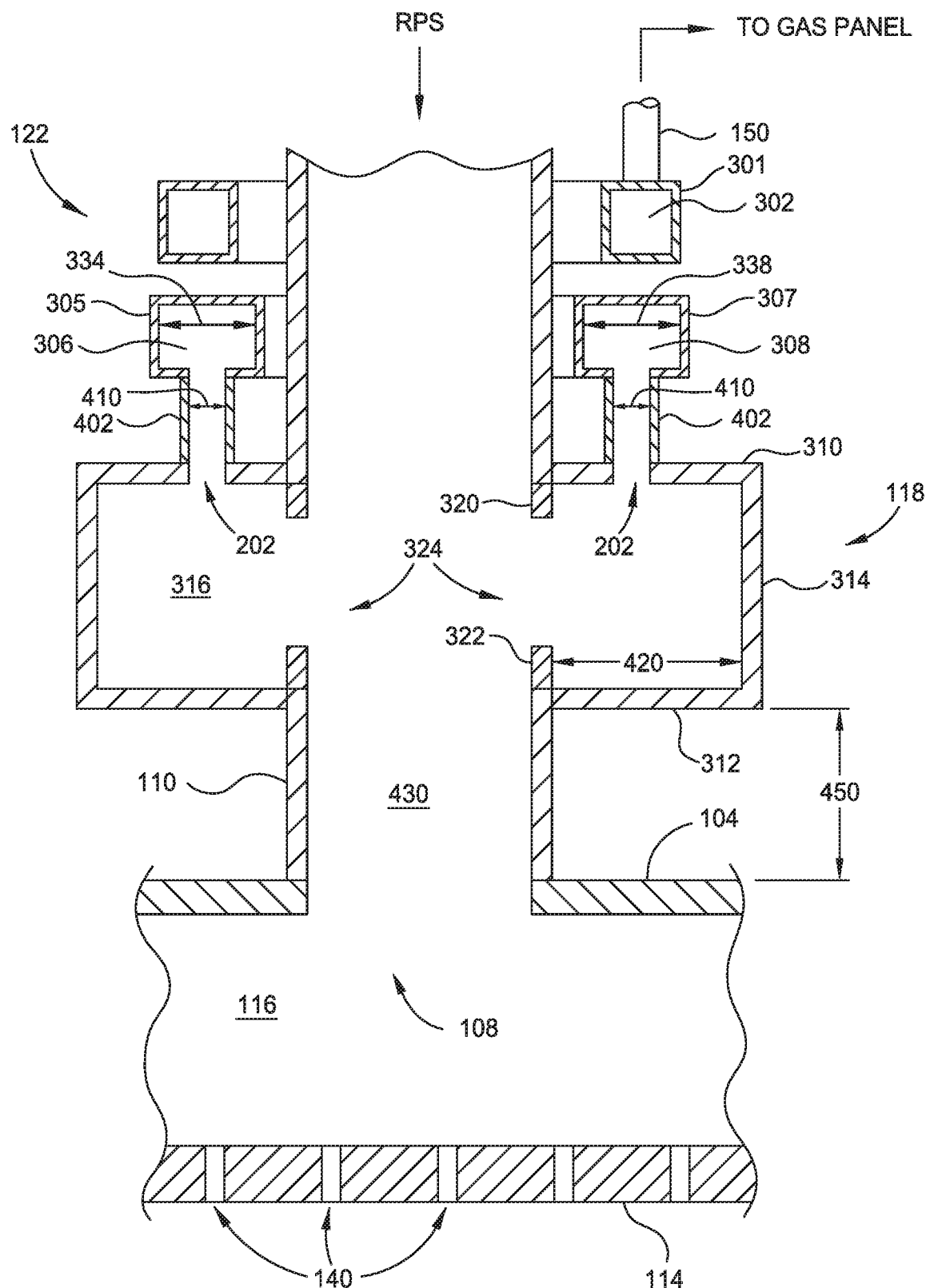
FIG. 4 illustrates a schematic, cross-sectional view of a branch gas feed assembly according to an embodiment of the disclosure.

FIG. 4 illustrates a schematic, cross-sectional view of the branch gas feed assembly 122 according to one embodiment. As illustrated, the second plenum 306 and the third plenum 308 are in fluid communication with the annular plenum 316 via one or more conduits 402. The one or more conduits 402 are aligned with the one or more inlet ports 202 formed through the first body member 310. Each of the one or more conduits 402 have substantially equal flow conductance.

In one embodiment, which can be combined with one or more embodiments discussed above, the one or more inlets 346, 348 illustrated in FIG. 2, are formed through the second plenum body 305 and the third plenum body 307, respectively, between the one or more inlet ports 202. That is, the one or more conduits 304 disposed between the first plenum body 301 and the second plenum body 305 and third plenum body 307 are offset from the one or more conduits 402 disposed between the plenum body 118 and the second plenum body 305 and the third plenum body 307.

An interior diameter 410 of the conduits 402 is smaller than an interior diameter 420 of the annular plenum 316. The plenum body 118 is spaced apart from the lid 104. For example, a distance 450 between the lid 104 and the second body member 312 is between about 0.5 inches to about 3.5 inches, such as between about 1 inch and about 2 inches, for example, about 1.5 inches. The distance 450 between the lid 104 and the second body member 312 enables the process gases to mix in the gas feed tube 110 before exiting the port 108. The distance 450 also prevents thermal activation of the process gases in the annular plenum 316 due to thermal radiation absorbed by the lid 104 during processing.

In one embodiment, which can be combined with one or more embodiments discussed above, the height 342 of the annular plenum 316 is smaller than the interior diameter 410 of the conduits 402. In this embodiment, a volume of the annular plenum 316 is smaller than a volume of the conduits 402 to increase a velocity of a fluid flowing through the conduits 402 to the annular plenum 316. That is, the smaller volume of the annular plenum 316 increases a velocity of the fluid flowing through the annular plenum 316 and into the gas feed tube 110 when compared to the fluid flow velocity of the fluid through the conduits 402, assuming an approximately and substantially constant fluid pressure for each of the conduits 304 (described with respect to FIG. 3) and the conduits 402.

Upon exiting the one or more conduits 402 via the one or more inlet ports 202, process gases fill the plenum 116 and enter the gas feed tube 110 through the apertures 324. A purge gas in the gas feed tube 110 travels from the remote plasma source, such as remote plasma source 112 illustrated in FIG. 1, toward the port 108 in the lid 104. Upon entering the gas feed tube 110, the process gases mix with the purge gas in a volume 430 of the gas feed tube 110. The gases (including the purge gas) exit the port 108 and enter the plenum 116 between the lid 104 and the showerhead 114 where the gases continue to mix before propagating through the plurality of passages 140 and entering the process volume, such as process volume 120 illustrated in FIG. 1.

Figure 5:
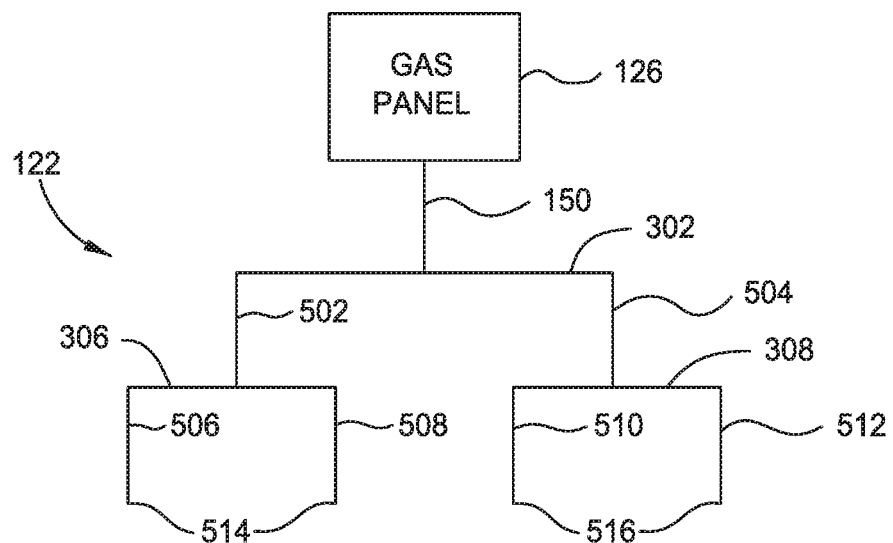
FIG. 5 illustrates a schematic diagram of a branch gas feed assembly according to an embodiment of the disclosure.

FIG. 5 illustrates a schematic diagram of the branch gas feed assembly 122 according to one embodiment. As discussed with respect to FIG. 1, the gas panel 126 is in fluid communication with the first plenum 302 via the conduit 150. The first plenum 302 is in fluid communication with the second plenum 306 via a first conduit 502. The first plenum 302 is also in fluid communication with the third plenum 308 via a second conduit 504. The first conduit 502 and the second conduit 504 have substantially equal flow conductance because the conduits 502, 504 have a substantially similar shape (e.g., cylindrical, rectangular, spheroidal, etc.) and a substantially similar diameter (e.g., the interior diameter 332 of the one or more conduits 304 illustrated in FIG. 3). That is, a rate of fluid flowing through the first conduit 502 is substantially equal to a rate of fluid flowing through the second conduit 504 (assuming constant fluid pressure).

The second plenum 306 is in fluid communication with at least two outlets 514 of the branch gas feed assembly 122 via a third conduit 506 and a fourth conduit 508. The third plenum 308 is in fluid communication with at least two outlets 516 of the branch gas feed assembly 122 via a fifth conduit 510 and a sixth conduit 512. The outlets 514 and the outlets 516 correspond to the plurality of outlets 128 of the branch gas feed assembly 122 shown in FIG. 1. Each of the third conduit 506, the fourth conduit 508, the fifth conduit 510, and the sixth conduit 512 have substantially equal flow conductance. For example, each of the third conduit 506, the fourth conduit 508, the fifth conduit 510, and the sixth conduit 512 have a substantially similar shape and dimensions (e.g., the interior diameter 410 of the one or more conduits 402 illustrated in FIG. 4). Thus, a rate of fluid flowing through each of the third conduit 506, the fourth conduit 508, the fifth conduit 510, and the sixth conduit 512 is substantially equal (assuming constant fluid pressure). In one embodiment, which can be combined with one or more embodiments discussed above, each of the outlets 514 and the outlets 516 have substantially equal flow conductance.

Figure 6:
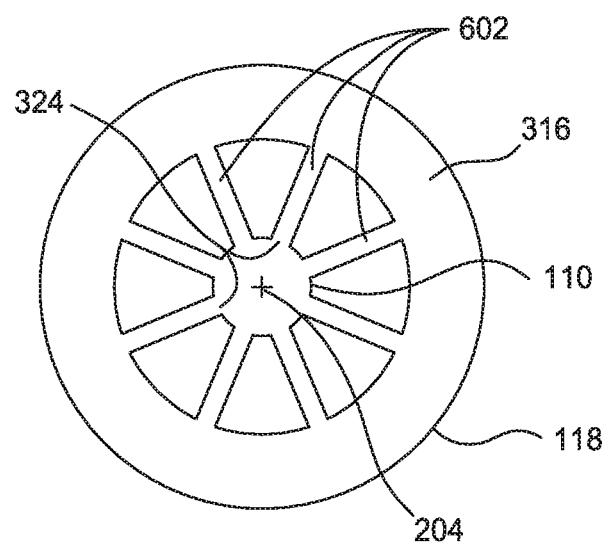
FIG. 6 illustrates plan view of an annular plenum according to an embodiment of the disclosure.

FIG. 6 illustrates a plan view of the annular plenum 316 according to one embodiment. In one embodiment, which can be combined with one or more embodiments discussed above, the annular plenum 316 is in fluid communication with the gas feed tube 110 via a plurality of passages 602. Each of the passages 602 is in fluid communication with one of the apertures 324 in the gas feed tube 110.

The passages 602 and the apertures 324 are radially distributed equidistant about the central axis 204 of the gas feed tube 110. Each of the passages 602 has substantially equal flow conductance. In one embodiment, which can be combined with one or more embodiments discussed above, the passages 602 are disposed substantially normal to the central axis 204 the gas feed tube 110 and parallel to the lid 104 of the process chamber (not shown in FIG. 6). In another embodiment, the passages 602 are inclined from the plenum body 118 towards the second end 134 of the gas feed tube 110 (not shown in FIG. 6). That is, the apertures 324 in the gas feed tube 110 are above outlets 128 of the branch gas feed assembly 122.

In summation, embodiments of the disclosure provide for improved gas delivery, gas distribution, and gas mixing for a plasma processing apparatus. The branch gas feed assembly described herein utilizes a plurality of plenums and conduits to more evenly distribute processes gases with substantially equal flow conductance to an annular plenum. The processes gases delivered to the annular plenum are mixed with a purge gas flowed through the gas feed tube. The mixing of process gases and the purge gas in the feed tube increases a residence time of the mixture prior to entry into the process volume via the showerhead which enables more complete mixing and improved distribution of the mixture. The improved mixing enables improved processing of a substrate in the process volume because the process gases and purge gas are more thoroughly mixed prior to entering the process volume. The improved substrate processing is manifested in deposition or etching processes which exhibit improved uniformity.

While the foregoing is directed to embodiments of the present disclosure, other and further embodiments of the disclosure may be devised without departing from the basic scope thereof, and the scope thereof is determined by the claims that follow.

The invention claimed is:

1. An apparatus, comprising:
   a lid and a chamber body defining a process volume therein, the lid having a port formed therethrough;
   a gas feed tube having a first end and a second end, an opening at the first end in fluid communication with the port;
   a first plurality of conduits having substantially equal flow conductance in fluid communication with the gas feed tube, each conduit of the first plurality of conduits terminating at one of a first plurality of outlets;
   a second plurality of conduits having substantially equal flow conductance, each conduit of the second plurality of conduits in fluid communication with one of the first plurality of outlets, each conduit of the second plurality of conduits terminating at one of a second plurality of outlets; and
   a plenum body defining an annular plenum therein, the plenum body having a plurality of inlet ports formed therein, each outlet of the second plurality of outlets in fluid communication with at least one of the plurality of inlet ports, the plurality of inlet ports spaced equidistant about a central axis of the plenum body, the gas feed tube having at least one aperture in fluid communication with the annular plenum, wherein the at least one aperture:
   is a continuous annular opening, or
   comprises a plurality of radially distributed openings about the central axis.

2. The apparatus of claim 1, wherein the plenum body is spaced apart from the lid.

3. The apparatus of claim 1, further comprising:
   a remote plasma source in fluid communication with the second end of the gas feed tube.

4. The apparatus of claim 1, wherein the second plurality of outlets are spaced equidistant about the central axis of the plenum body.

5. An apparatus, comprising:
   a lid and a chamber body defining a process volume therein, the lid having a port formed therethrough;
   a gas feed tube having a first end and a second end, an opening at the first end in fluid communication with the port;
   a first plurality of conduits having substantially equal flow conductance in fluid communication with the gas feed tube, each conduit of the first plurality of conduits terminating at one of a first plurality of outlets;
   a second plurality of conduits having substantially equal flow conductance, each conduit of the second plurality of conduits in fluid communication with one of the first plurality of outlets, each conduit of the second plurality of conduits terminating at one of a second plurality of outlets;
   a plenum body defining an annular plenum therein, the plenum body having a plurality of inlet ports formed therein, each outlet of the second plurality of outlets in fluid communication with at least one of the plurality of inlet ports, the plurality of inlet ports spaced equidistant about a central axis of the plenum body, the gas feed tube having at least one aperture in fluid communication with the annular plenum; and
   a showerhead disposed between the process volume and the opening at the first end of the gas feed tube, the showerhead having a plurality of passages formed therethrough, the plurality of passages in fluid communication with the gas feed tube and the process volume.

6. An apparatus, comprising:
   a lid having a port formed therethrough;
   a gas feed tube having a first end and a second end, an opening at the first end in fluid communication with the port;
   a first plenum body defining a first plenum therein, the first plenum body having a first inlet in fluid communication with the gas feed tube, the first plenum body having at least a first outlet and a second outlet, the at least the first outlet and the second outlet each having substantially equal flow conductance;
   a second plenum body defining a second plenum therein, the second plenum body having at least a second inlet and a third inlet, the second inlet and the third inlet in fluid communication with the at least the first outlet and the second outlet, the second plenum body having at least a third outlet, a fourth outlet, a fifth outlet, and a sixth outlet, the at least the third outlet, the fourth outlet, the fifth outlet, and the sixth outlet each having substantially equal flow conductance;
   a third plenum body defining an annular plenum therein, the third plenum body having a plurality of inlet ports formed therein, the plurality of inlet ports spaced equidistant about a central axis of the third plenum body and in fluid communication with at least one of the third outlet, the fourth outlet, the fifth outlet, and the sixth outlet, the gas feed tube having at least one aperture in fluid communication with the annular plenum; and
   a showerhead disposed adjacent to the opening at the first end of the gas feed tube, the showerhead having a plurality of passages formed therethrough, the plurality of passages in fluid communication with the gas feed tube.

7. An apparatus, comprising:
   a lid having a port formed therethrough;
   a gas feed tube having a first end and a second end, an opening at the first end in fluid communication with the port;
   a first plenum body defining a first plenum therein, the first plenum body having a first inlet in fluid communication with the gas feed tube, the first plenum body having at least a first outlet and a second outlet, the at least the first outlet and the second outlet each having substantially equal flow conductance;
   a second plenum body defining a second plenum therein, the second plenum body having at least a second inlet and a third inlet, the second inlet and the third inlet in fluid communication with the at least the first outlet and the second outlet, the second plenum body having at least a third outlet, a fourth outlet, a fifth outlet, and a sixth outlet, the at least the third outlet, the fourth outlet, the fifth outlet, and the sixth outlet each having substantially equal flow conductance; and a third plenum body defining an annular plenum therein, the third plenum body having a plurality of inlet ports formed therein, the plurality of inlet ports spaced equidistant about a central axis of the third plenum body and in fluid communication with at least one of the third outlet, the fourth outlet, the fifth outlet, and the sixth outlet, the gas feed tube having at least one aperture in fluid communication with the annular plenum, wherein the at least one aperture:

is a continuous annular opening, or comprises a plurality of radially distributed openings about the central axis.

8. The apparatus of claim 7, further comprising:
a remote plasma source in fluid communication with the second end of the gas feed tube.

9. The apparatus of claim 7, wherein a volume of the annular plenum is less than a volume of each of the first plenum and the second plenum.

10. The An apparatus, comprising:
a lid having a port formed therethrough;
a gas feed tube having a first end and a second end, an opening at the first end in fluid communication with the port;
a first plenum body defining a first plenum therein, the first plenum body having a first inlet in fluid communication with the gas feed tube, the first plenum body having at least a first outlet and a second outlet, the at least the first outlet and the second outlet each having substantially equal flow conductance;
a second plenum body defining a second plenum therein, the second plenum body having at least a second inlet and a third inlet, the second inlet and the third inlet in fluid communication with the at least the first outlet and the second outlet, the second plenum body having at least a third outlet, a fourth outlet, a fifth outlet, and a sixth outlet, the at least the third outlet, the fourth outlet, the fifth outlet, and the sixth outlet each having substantially equal flow conductance; and
a third plenum body defining an annular plenum therein, the third plenum body having a plurality of inlet ports formed therein, the plurality of inlet ports spaced equidistant about a central axis of the third plenum body and in fluid communication with at least one of the third outlet, the fourth outlet, the fifth outlet, and the sixth outlet, the gas feed tube having at least one aperture in fluid communication with the annular plenum, wherein the third plenum body is spaced apart from the lid.

11. An apparatus, comprising:
a gas feed tube having a first end and a second end opposite the first end, the gas feed tube having a plurality of apertures formed therethrough;
a first plenum body defining a first plenum therein, the first plenum in fluid communication with the gas feed tube, the first plenum body having a first plurality of outlets formed therein;
a second plenum body defining a second plenum therein, the second plenum body having a first plurality of inlets and a second plurality of outlets;
a third plenum body defining a third plenum therein, the third plenum body having a second plurality of inlets and a third plurality of outlets;
a fourth plenum body defining an annular plenum therein, the fourth plenum body having a third plurality of inlets and a fourth plurality of outlets formed therein;
a first plurality of conduits, each disposed between one of the first plurality of outlets and one of the first plurality of inlets and the second plurality of inlets;
a second plurality of conduits, each disposed between one of the second plurality of outlets and one of the third plurality of inlets;
a third plurality of conduits, each disposed between one of the third plurality of outlets and one of the third plurality of inlets; and
one or more passages disposed between the fourth plurality of outlets and the plurality of apertures.

12. The apparatus of claim 11, wherein a number of the third plurality of inlets is equal to a number of the second plurality of outlets and the third plurality of outlets.

13. The apparatus of claim 11, wherein the apertures are spaced equidistant about a central axis of the gas feed tube.

14. The apparatus of claim 11, wherein each of the first plenum body, the second plenum body, the third plenum body, and the fourth plenum body at least partially surround the gas feed tube.

15. The apparatus of claim 11, wherein a volume of the annular plenum is less than a volume of each of the first plenum, the second plenum, and the third plenum.

16. The apparatus of claim 11, wherein each of the first plurality of outlets, the second plurality of outlets, the third plurality of outlets, and the fourth plurality of outlets have substantially equal flow conductance.

* * * * *